United States Patent
Distefano et al.

(10) Patent No.: US 6,218,215 B1
(45) Date of Patent: Apr. 17, 2001

(54) METHODS OF ENCAPSULATING A SEMICONDUCTOR CHIP USING A SETTABLE ENCAPSULANT

(75) Inventors: Thomas H. Distefano, Monte Sereno; Craig S. Mitchell, Santa Clara, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/520,357

(22) Filed: Mar. 7, 2000

Related U.S. Application Data

(62) Division of application No. 09/166,812, filed on Oct. 6, 1998, now Pat. No. 6,080,605.
(60) Provisional application No. 60/062,471, filed on Oct. 15, 1997.

(51) Int. Cl.[7] .......................... H01L 21/44; H01L 21/48; H01L 21/50
(52) U.S. Cl. .......................... 438/108; 438/106; 438/118; 438/124; 438/125; 438/126; 438/127
(58) Field of Search .................... 438/108, 118, 438/124, 125, 126, 127

(56) References Cited

U.S. PATENT DOCUMENTS

| | | | |
|---|---|---|---|
| 4,592,928 | * 6/1986 | Antonen | 427/93 |
| 4,996,170 | 2/1991 | Baird | 437/219 |
| 5,148,265 | 9/1992 | Khandros et al. | 357/80 |
| 5,225,023 | * 7/1993 | Wojnarowski et al. | 156/298 |
| 5,272,113 | * 12/1993 | Quinn | 437/205 |
| 5,348,607 | * 9/1994 | Wojnarowski et al. | 156/298 |
| 5,455,390 | 10/1995 | DiStefano et al. | 174/262 |
| 5,518,964 | 5/1996 | DiStefano et al. | 437/209 |
| 5,659,652 | 8/1997 | D'Entremont. | |
| 5,659,952 | 8/1997 | Kovac et al. | 29/840 |
| 5,688,716 | 11/1997 | DiStefano et al. | 437/182 |
| 5,766,987 | 6/1998 | Mitchell et al. | 438/126 |
| 5,773,322 | 6/1998 | Weld | 438/117 |
| 5,776,796 | 7/1998 | DiStefano et al. | 438/106 |

OTHER PUBLICATIONS

HAAKE, Rheometers, pp. 12–21.

\* cited by examiner

*Primary Examiner*—John F. Niebling
*Assistant Examiner*—David A Zarneke
(74) *Attorney, Agent, or Firm*—Lerner, David, Littenberg, Krumholz & Mentlik, LLP

(57) ABSTRACT

A method of making a semiconductor chip package by attaching a chip to a dielectric layer; placing the dielectric layer and chip into a mold; disposing a thixotropic composition that has bee sheared to reduced its viscosity into the mold and curing the thixotropic composition after the chip and dielectric layer have been removed from the mold.

A method of making a semiconductor chip package without using a mold by disposing a sheared thixotropic composition between a semiconductor chip and a dielectric layer and then curing the thixotropic composition to form a cured encapsulant.

A method of making a semiconductor chip package without using a mold during the curing step and without the need to use a thixotropic composition by placing a semiconductor chip attached to a dielectric layer into a mold and disposing a liquid composition between the chip and the dielectric layer, forming a cured skin on the liquid composition, removing the work-piece from the mold and then completely the cure of the liquid composition.

14 Claims, 7 Drawing Sheets

METHODS OF ENCAPSULATING A SEMICONDUCTOR CHIP USING A SETTABLE ENCAPSULANT

CROSS REFERENCE TO RELATED APPLICATIONS

This application is a divisional application of application Ser. No. 09/166,812 filed on Oct. 6, 1998 now U.S. Pat. No. 6,080,605.

The present application is claims benefit of U.S. Provisional Patent Ser. No. 60/062,471, filed on Oct. 15, 1997, the disclosure of which is hereby incorporated by reference herein.

BACKGROUND OF THE INVENTION

1. Field of the Invention

The present invention relates to art of microelectronic packaging and more specifically to methods of encapsulating a semiconductor chip package using a pseudoplastic encapsulant having thixotropic properties.

2. Description of the Related Art

In the construction of semiconductor chip package assemblies, it has been found desirable to interpose an encapsulant between and/or around elements of the semiconductor package. An encapsulant may be used in an effort to reduce and/or redistribute the strain and stress on the connections between the semiconductor chip and the supporting circuitized substrate during operation of the chip. An encapsulant may also serve to seal the elements against corrosion, as well as to insure intimate contact between the encapsulant, the semiconductor chip and the other elements of the chip package.

Semiconductor chip packages are often encapsulated using liquid compositions that cure to form encapsulants. Such compositions frequently cure upon exposure to elevated temperatures. In order to encapsulate a semiconductor package, the liquid composition is dispensed or injected into the package. Often, a mold or fixture is placed around the package prior to dispensing the liquid composition. The mold is then placed in oven to cure the liquid composition. Once the composition is cured, the mold is removed from the oven and the package is removed from the mold. It would be desirable to remove the semiconductor chip package from the mold before curing the composition because the cure time of the composition is extended when the package is encased in the mold.

Methods of using curable liquid compositions to encapsulate semiconductor chip packages are described in, for example, commonly assigned U.S. Pat. No. 5,659,652; U.S. Pat. No. 5,766,987; U.S. patent application Ser. No. 09/067,698 filed Apr. 28, 1998; U.S. patent application Ser. No. 08/610,610, filed Mar. 7, 1997; and U.S. Pat. No. 5,776,796, the disclosures of which are incorporated herein by reference. In certain embodiments of such patents and applications, a microelectronic assembly having a semiconductor chip and a flexible, sheet-like dielectric element is disclosed. Contacts on the chip are electrically interconnected to terminals on the dielectric element. The assembly may also include a compliant layer such as an elastomer or gel disposed between the dielectric sheet and the chip to provide mechanical decoupling of the sheet and terminals from the chip. As disclosed in the aforementioned patents and patent applications, such compliant layers can be made by providing a porous layer, such as a plurality of compliant pads, between the chip and the dielectric sheet, electrically connecting the terminals to contacts on the chip and then encapsulating the resulting assembly with a curable liquid composition so that the composition penetrates into the porous layer and also covers the connections at the contacts on the chip. Upon curing, the composition forms a compliant encapsulant which becomes part of the compliant layer. In making assemblies of this nature, it is desirable to ensure that the encapsulant completely fills the porous layer, to provide a substantially void-free compliant layer in the final assembly.

Several useful methods of applying and curing the encapsulant in microelectronic assemblies have been proposed in commonly assigned, copending United States patents applications and patents. For example, as set forth in the aforementioned U.S. Pat. No. 5,766,987, coverlays may be applied over the top and bottom surfaces of the assembly. Typically, several assemblies are provided in a side by side arrangement so the same top coverlay lies on the top surfaces of several assemblies. The coverlay and assembly are held in a fixture. After the space between the coverlays is brought to sub-atmospheric pressure, the fixture is tilted and the liquid encapsulant is poured into the space between the cover layers. The encapsulant is then cured while the components remain in place in the fixture.

As described in U.S. Pat. No. 5,659,952, the disclosure of which is incorporated herein by reference, and the aforementioned U.S. Pat. No. 5,776,796, the encapsulant may be applied using a nozzle or a syringe around the periphery of each subassembly. For example, as shown in the '796 patent, a plurality of assemblies can be made using a single, unitary dielectric sheet element which incorporates the dielectric sheets of several subassemblies. The chips may be attached to the dielectric sheet and electrically connected to the terminals of the dielectric sheet. At this point, a needle connected to an encapsulant dispenser is used to trace a pattern around the peripheries of the individual chips, so that the encapsulant flows into the space between each chip and the dielectric layer. A coverlay may be used to close the bond windows in the dielectric sheet during this process. Also, during this process, the dielectric sheet typically is held in a frame. In a further variant of this process, described in U.S. patent application Ser. No. 08/975,590 filed on Nov. 20, 1997, the disclosure of which is also incorporated by reference herein, the frame and dielectric sheet are placed in a vacuum chamber, and the encapsulant dispensing operation is conducted inside the chamber, while the assembly is under vacuum. When the vacuum is released, and the chamber is brought to atmospheric or superatmospheric pressure, the pressure forces the encapsulant into the porous layer between the chip and the dielectric sheet. Further, as described in U.S. patent application Ser. No. 09/012,590, filed Jan. 23, 1998, the disclosure of which is also incorporated by reference herein, it is convenient to use a frame to hold the dielectric sheet during the assembly procedures. The frame allows for mechanical handling of the dielectric sheet without direct contact with the portions of the sheet which will be incorporated into the final assembly. For example, the compliant pads used to form the porous layer may be applied to the dielectric sheet while the dielectric sheet is mounted on the frame and the chips may be mechanically attached to the pads and electrically connected to the terminals also while the dielectric sheet is mounted on the frame.

Other methods of encapsulating an assembly are disclosed in the aforementioned application Ser. No. 09/067,698. In certain embodiments of such application, for example, the encapsulating method includes the steps of providing a plurality of assemblies within an opening in a frame and providing top and bottom sealing layers which are sealingly connected to the frame and which extend across the opening of the frame. The top and bottom sealing layers together with the frame define an enclosed space encompassing the assemblies. The frame, sealing layers and assemblies are engaged in a fixture as, for example, by clamping the frame and sealing layers between top and bottom elements of the fixture. While the frame is engaged in the fixture a liquid encapsulant is injected into the enclosed space, between the sealing layers and around the assemblies. The encapsulant is then cured. After curing, the assemblies may be further processed before singulation or may be removed from the frame and severed from one another. While the above described inventions offer important advantages, still other improvements are desirable.

SUMMARY OF THE INVENTION

The present invention relates to a method of making a semiconductor chip package. The method of this aspect of the present invention includes the steps of attaching at least one microelectronic element, such as a semiconductor chip, to a dielectric layer; placing the dielectric layer and attached microelectronic element(s) into a mold or fixture; sealingly engaging the mold with the dielectric layer; shearing a thixotropic composition to reduce its viscosity; disposing the sheared thixotropic composition into the mold such that the area between the microelectronic element(s) and the dielectric layer is completely filled; removing the dielectric layer with the attached microelectronic element(s) and thixotropic composition from the mold; and curing the thixotropic composition to form a cured encapsulant between the microelectronic element(s) and the dielectric layer. On preferred embodiments, the sheared composition is disposed into the mold via a dispense process or an injection process.

The present invention also relates to a method of making a semiconductor chip package without using a mold. The method of this aspect of the present invention includes the steps of attaching at least one microelectronic element to a dielectric layer; shearing a thixotropic composition to reduce its viscosity; disposing the sheared composition between the microelectronic element(s) and the dielectric layer; curing the thixotropic composition to form a cured encapsulant between the microelectronic element(s) and the dielectric layer. In an alternative embodiment, the dielectric layer may be attached to a frame prior to the dispense step. In a particularly preferred embodiment, a coverlay is used in conjunction with the frame.

The present invention also relates to a method of packaging a semiconductor chip without using a mold during the curing step and without the need to use a thixotropic composition. The method of this aspect of the present invention includes the steps of
attaching at least one microelectronic element to a dielectric layer; placing the dielectric layer with the attached microelectronic element(s) into a mold or fixture; sealingly engaging the mold with the dielectric layer; disposing a liquid composition to completely fill the area between the microelectronic element(s) and the dielectric layer; partially curing the liquid composition to form a cured skin on the composition; removing the dielectric layer with the partially cured composition and attached microelectronic element(s) from the mold; and vii) completing the cure of the liquid composition to form a cured encapsulant.

If a plurality of chips are disposed on the dielectric layer, then the methods of the present invention can be used to simultaneously make a plurality of semiconductor chip packages by including the step of dicing a plurality of individual semiconductor chip package from the dielectric layer after the curing step.

BRIEF DESCRIPTION OF THE DRAWINGS

FIG. 1 is a side view of a plurality of microelectronic elements attached to a dielectric tape layer.

FIG. 2 is a side view of the work-piece of FIG. 1 after it has been disposed in a mold.

FIG. 3 is a side view of the work-piece and mold of FIG. 2 after the mold cavity has been completely filled with a thixotropic encapsulant composition.

FIG. 4 is a side view of the work-piece and mold of FIG. 3 after the work-piece has been removed from the mold and the thixotropic encapsulant composition has subsequently been cured to form a cured encapsulant.

FIGS. 5–14 are depict various steps of another embodiment of the present invention.

FIG. 5 is a top perspective view of a frame used in the method of the present invention.

FIG. 6 is a top perspective view of the frame of FIG. 5 after a sheet of dielectric "tape" has been applied to the bottom surface.

FIG. 8 is a top perspective view of the frame of FIG. 7a after a coverlay has been attached to the top surface of the frame.

FIG. 9 is a top perspective view of the frame of FIG. 8 after a thixotropic encapsulant composition has been applied between the tape and the coverlay, and cured.

FIG. 10 is perspective view of a plurality of semiconductor chip devices packaged according to a method of the prior art wherein the need to contain the encapsulant until the cure process is completed in order to prevent flow out of the encapsulant.

FIGS. 11–14 depict various microelectronic elements that can be made using the methods of the present invention.

FIG. 11 is a side view of a fan-in type semiconductor chip package.

FIG. 12 is a side view of a fan-out type semiconductor chip package.

FIG. 13 is a side view of a fan-in/fan-out type semiconductor chip package.

FIG. 14 is a side view of a wafer scale package.

FIG. 15 is a side view of the work-piece of FIG. 1 after it has been placed in a mold and a liquid composition has begun to be dispensed into the mold cavity.

FIG. 16 is a side view of the work-piece of FIG. 15 after the mold cavity has been filled with a liquid encapsulant composition and after a portion of such composition has been cured to form a cured skin.

FIG. 17 is a side view of the work-piece of FIG. 16 after the work-piece has been removed from the mold and the remaining uncured portions of the liquid composition have subsequently been cured to form a complaint encapsulant.

DETAILED DESCRIPTION OF THE PREFERRED EMBODIMENTS

Figure 1:
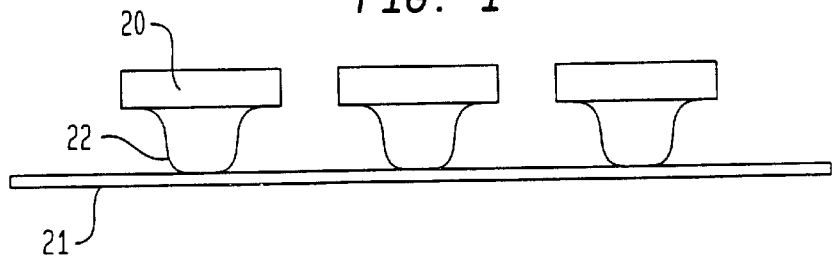
FIGS. 1–4 depict various steps in one embodiment of the present invention.
Figure 2:
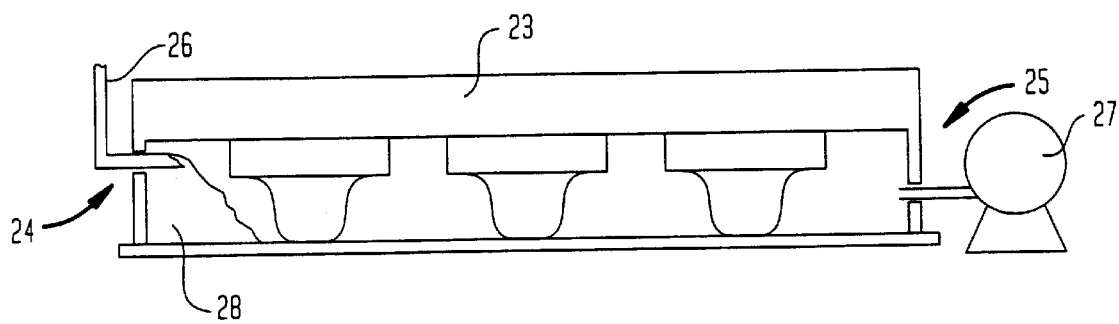
Figure 3:
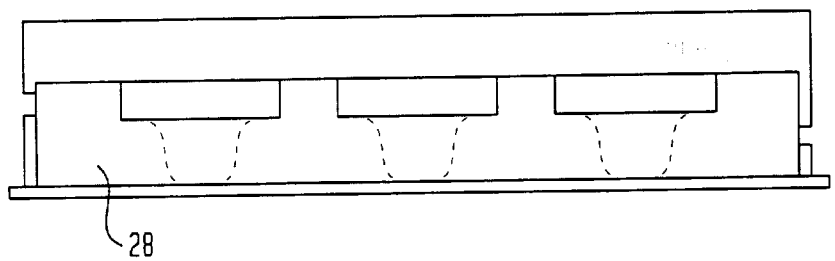

The present invention relates to a method of making a semiconductor chip package using a thixotropic encapsulating composition. Progressive steps in the method of this aspect of the invention are depicted in FIGS. 1–4. Such figures, as well as the FIGS. 5–17, are not drawn to scale. Some of the dimensions in such figures are exaggerated to better describe the methods of the present invention. As depicted in FIG. 1, the method of this aspect of the present invention includes the step of attaching at least one microelectronic element 20 to a dielectric layer 21. The microelectronic element may be a semiconductor chip, a plurality of such chips or a plurality of such chips disposed on a wafer. There are three semiconductor chips 20 attached to dielectric layer 21 in FIG. 1. As depicted in FIG. 2, a mold 23, which is capable of being sealingly engaged with the dielectric layer, is provided. The dielectric layer and the attached semiconductor chips are placed in mold 23. Mold 23 is equipped with one or more inlet ports 24. Mold 23 may also be equipment with a vacuum port for connecting a vacuum pump so that a vacuum environment may be created within mold 23. A needle 26 is inserted in inlet port 24. A thixotropic composition 28 is dispensed or injected through the needle 26 into the cavity created by mold 23. As thixotropic composition 28 flows through needle 26, it is exposed to a shearing force which reduces its viscosity. The dimensions of needle 26, the thixotropic properties composition 28 and/or the injection pressure used to inject composition 28 into the cavity may be used to adjust the viscosity of the thixotropic composition. As depicted in FIG. 3, thixotropic composition 28 is injected into the cavity created by mold 23 until the area between the chips 20 and the dielectric layer 21 is completely filled.

Compositions that are suitable for use a thixotropic composition must be capable of curing to form cured encapsulants. In preferred embodiments, such compositions cure upon exposure to heat. Such compositions should also be sufficiently pseudoplastic to allow the composition to completely flow between the areas between the microelectronic elements and the dielectric layer after being dispensed from the dispense needle. For purposes of this specification, a pseudoplastic fluid is defined as a material whose viscosity decreases upon exposure to a shear force. The decrease in viscosity with increasing shear rate, which is a defining characteristic of pseudoplastic fluids, is believed to be the result of a number of factors. One of those factors is the degree of aggregation of filler materials in the fluid. During a shearing process, filler particle aggregates may be broken down thereby reducing the viscosity of the fluid. Another characteristic of a fluid that may result in pseudoplastic properties, is the ability of the molecules of the fluid to be aligned. Long polymeric molecules may de-tangle and align in the direction of shear during a shearing process. The composition must also be sufficiently thixotropic to prevent flow-out of the composition when the mold is removed. A thixotropic fluid is defined as a pseudoplastic fluid that will regain some or all of its initial viscosity when the shear force is removed. Some thixotropic materials require an extended rest period to regain viscosity after the cessation of the application of the shear force. Such rest period is also sometimes referred to as a "re-gel" time. Other thixotropic materials regain viscosity quite rapidly. In preferred embodiments, the time required, after the shear force is removed, for composition 28 to regain sufficient viscosity to prevent flow-out is less than 1 minute, more preferably less than 10 seconds. In preferred embodiments, the initial viscosity of the thixotropic composition is greater than 100,000 centipoise at 25 C, more preferably greater than 150,000 centipoise at 25 C; and the reduced viscosity is less than 10,000 centipoise at 25 C; and the time period required for the thixotropic composition to regain 65% of its initial viscosity is less than 1 minute, more preferably less than 10 seconds. The thixotropic composition cures to form an encapsulant that is preferably selected from the group consisting of silicone elastomers, silicone gels, epoxies, and flexiblized epoxies.

The viscosity of some pseudoplastic and some thixotropic materials is only effected within a certain range of shear rates. Thixotropic composition 28 and the dispense conditions should be selected such that the viscosity of composition 28 will be sufficiently low upon exiting the dispense needle 26 to completely fill the areas between the microelectronic elements and dielectric layer 21 and such that the viscosity of composition 28 will be sufficiently high upon the removal of mold 23 to prevent flow-out.

After the thixotropic composition is applied to the dielectric layer, the shear force may continued to be applied in order to maintain the low viscosity of the composition and to insure that each microelectronic element is encapsulated as desired. Once sufficient shear force has been applied to the thixotropic composition to ensure that the areas between each microelectronic element and the dielectric layer have enough thixotropic composition to encapsulate the assembly as desired, the shear force may be reduced or removed. Once the shear force is removed the thixotropic material will begin to regain some or all of its initial higher viscosity.

Figure 4:
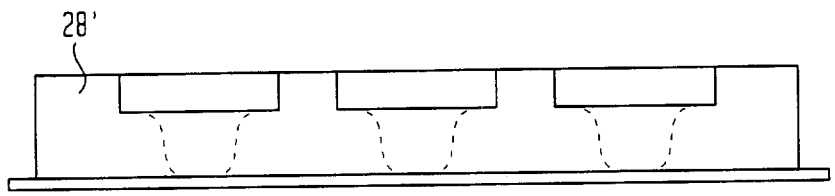

After the shearing force is removed, thixotropic composition 28 should remain in mold 23 until its viscosity has increased sufficiently to prevent composition 28 from flowing prior to and during the curing step. Mold 23 may then be removed, as depicted in FIG. 4. Dielectric layer 21, microelectronic element(s) 20 and composition 28 are then placed in a curing oven for a time and at a temperature sufficient to cure composition 28 to form a cured encapsulant 28'.

In an alternative embodiment, composition 28 is only partially cured, to the extent necessary to prevent the composition from flowing out of the assembly, before the assembly is removed from the curing oven. Composition 28 may then be fully cured to form cured encapsulant 28' in a later processing step.

A plurality of conductive connection elements, such as solder balls, may be disposed on the bottom surface of the dielectric layer. Each of solderball can be electrically connected to one of the leads to provide a means for connecting a packaged semiconductor chip to a substrate. The dielectric layer may then be diced to form a plurality of individual semiconductor devices.

In preferred embodiments, the dielectric sheet is flexible. In particularly preferred embodiments, the dielectric sheet is comprised of a polyimide.

Figure 5:
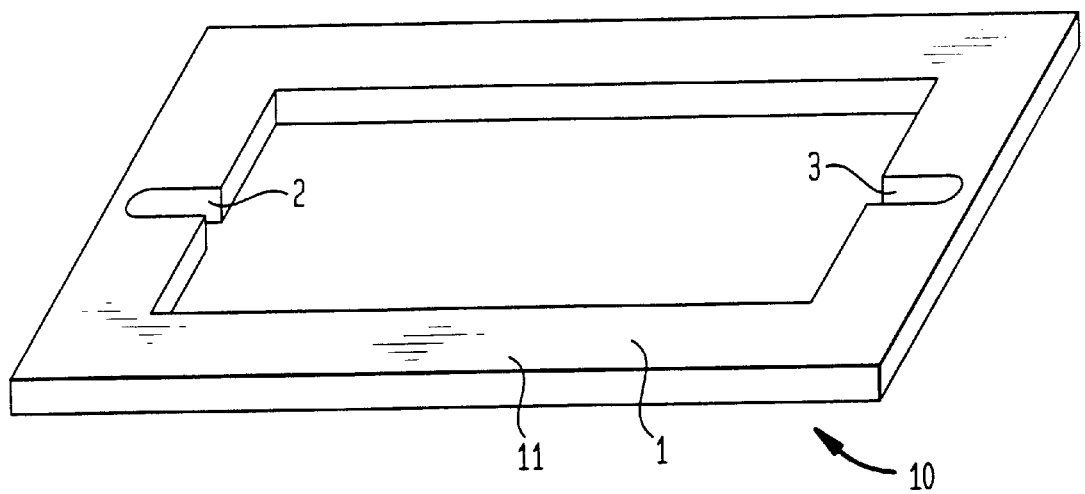
Figure 6:
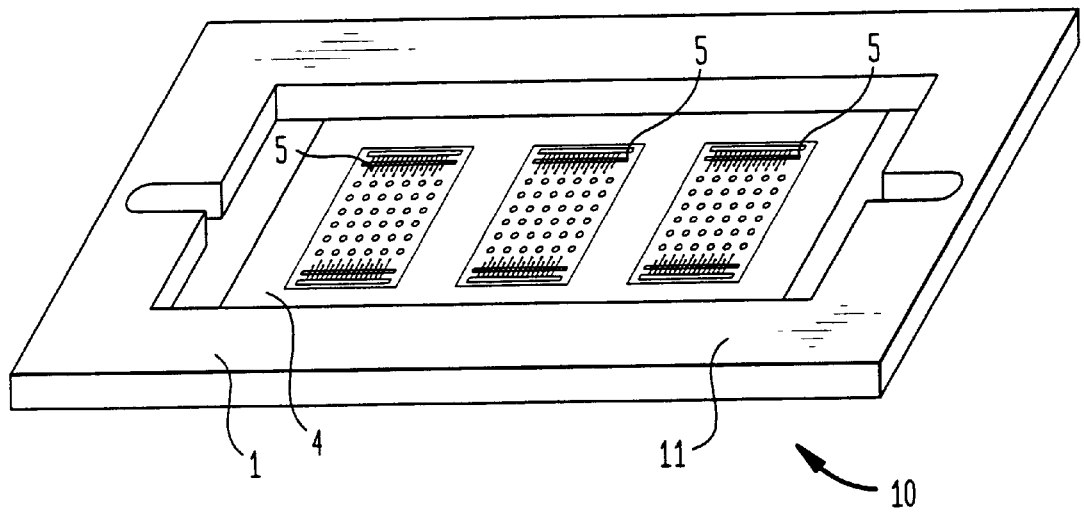
Figure 6A:
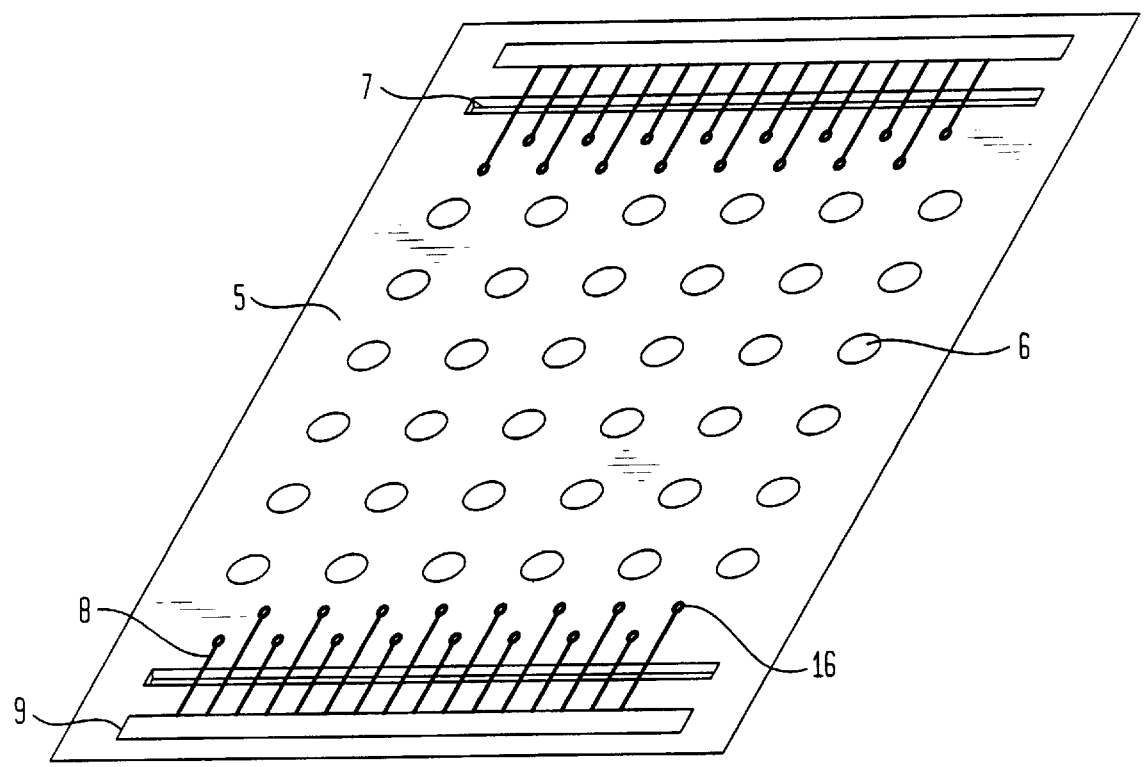
FIG. 6a is an exploded view of a portion of FIG. 6 depicting circuit features on the tape.
Figure 7A:
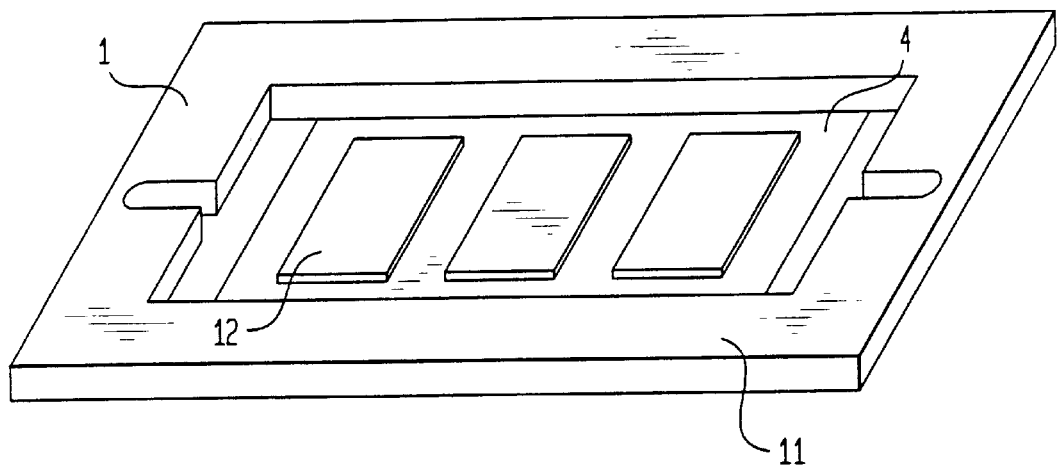
FIG. 7a is a top perspective view of the frame of FIG. 6 after a plurality of microelectronic elements have been attached to the tape.
Figure 7B:
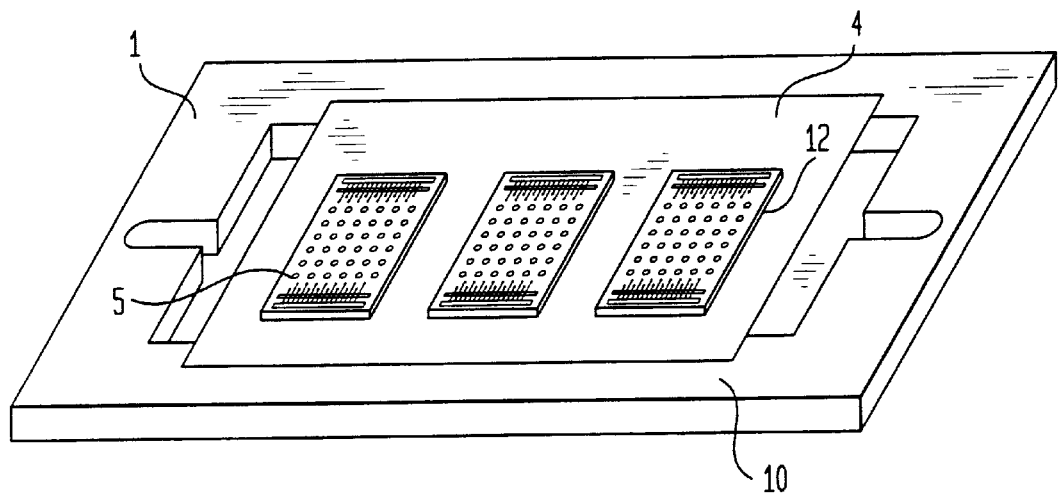
FIG. 7b is a bottom perspective view of the frame of FIG. 6 after the plurality of microelectronic elements have been attached to the tape.

The present invention also relates to a method of making a semiconductor chip package without using a mold. Progressive steps in one embodiment of this aspect of the present invention are depicted in FIGS. 5–14. As depicted in FIG. 5, a frame 1 is provided. The frame aids in handling aligning the dielectric layer during the various processing steps. Frame 1, unlike the mold or fixture referenced above, does not need to be sealingly engaged with the dielectric layer. Frame 1 has a central opening, which in preferred embodiments is sized to accommodate a 35 mm or 70 mm wide stripe of a dielectric sheet. The central opening also preferably includes two radially like extension disposed on opposite ends of the frame. One of the radially like extensions, 2, may be used as a dispense port. The other radially like extension, 3, may be used as another dispense port, or more preferably, as a vacuum port. Frame 1 also has a top surface 11 and a bottom surface 10. As depicted in FIG. 6, a dielectric sheet 4 is attached to the bottom surface 10 of frame 1. Dielectric sheet 4 has a least one region 5 having a plurality of circuit features. The dielectric sheet depicted in FIG. 6 has three such regions 5. FIG. 6a is an exploded view of one of the regions 5. As depicted in FIG. 6a, which is an exploded view of one of the regions 5, the plurality of circuit features include a plurality of compliant spacer 6, and a plurality of electrically conductive leads 8. Each lead 8 has a tip end which is connected to a bus bar 9 and a terminal end which is connected to an electrically conductive terminal 16. A portion of each lead 8 is disposed over a bond window 7. A face surface of a microelectronic element 12 is attached to each region 5 of dielectric layer 4. As depicted in FIG. 7a, each microelectronic element 12 may be a semiconductor chip. Microelectronic element 12 may also be a plurality of semiconductor chips or an interconnected plurality of such chips disposed on a wafer. The step of attaching each microelectronic element 12 to each region 5 may include the use of a die attach adhesive. The plurality of leads associated with each region are bonded to contacts on the face surface of the microelectronic element. This may be done by introducing a bonding tool through bonding window 7, franging the lead from the bus bar and bonding the newly franged lead to the contact using heat, pressure and/or thermosonic bonding. FIG. 7b is a bottom perspective view of the assembly of FIG. 7a.

Figure 8:
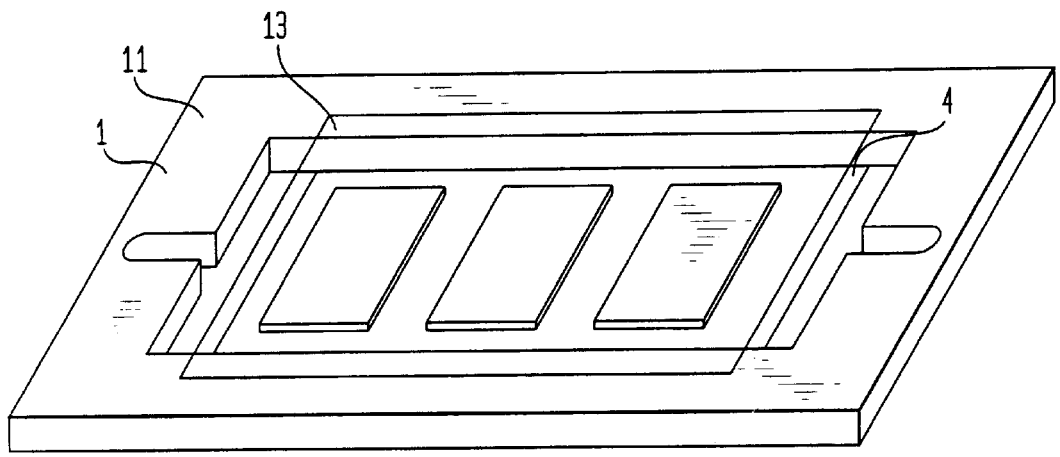
Figure 9:
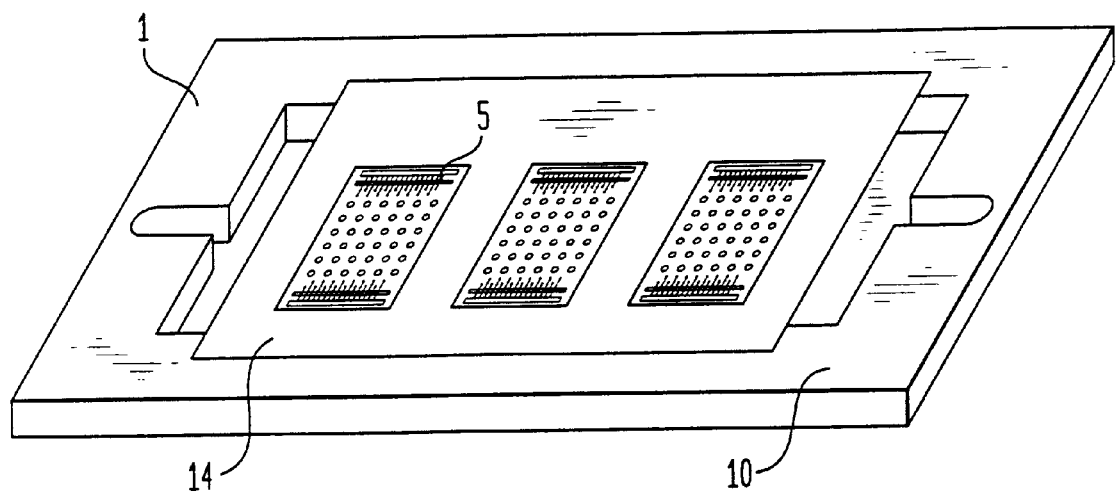

FIG. 8 is a top perspective view of the assembly of FIG. 7a after a coverlay 13 is disposed over dielectric sheet 4 and attached to the top surface 11 of frame 1. In preferred embodiments, the coverlay material is made of a thin sheet of polyimide. As depicted in FIG. 9, after the coverlay is in place, a thixotropic composition is disposed between the coverlay and the dielectric sheet. In preferred embodiments, the disposing step includes a step selected from dispensing and injection the thixotropic composition. Prior to or during the disposing step, the thixotropic composition, is subjected to a shearing force to reduce its viscosity. Shearing forces which may be used include such processes as stirring, mixing, rolling and/or forcing the composition through an orifice. Features on the dielectric sheet, such as the compliant spacers, may be used as viscosity reducing agents by subjecting the thixotropic composition to a shearing forces as such composition flows past and between such features. The thixotropic composition should be curable to form a cured encapsulant. In preferred embodiments, the time required, after the shear force is removed, for composition 28 to regain sufficient viscosity to prevent flow-out is less than 1 minute, more preferably less than 10 seconds. In preferred embodiments, the initial viscosity of the thixotropic composition is greater than 100,000 centipoise at 25 C, more preferably greater than 150,000 centipoise at 25 C; and the reduced viscosity is less than 10,000 centipoise at 25 C; and the time period required for the thixotropic composition to regain 65% of its initial viscosity is less than 1 minute, more preferably less than 10 seconds. The thixotropic composition cures to form an encapsulant that is preferably selected from the group consisting of silicone elastomers, silicone gels and flexibilized epoxies. In preferred embodiments, the dielectric sheet is flexible. In particularly preferred embodiments, the dielectric sheet is comprised of a polyimide.

Using the method of the present invention, the time and/or the energy required to make a semiconductor chip package may be reduced because the time and/or the energy needed to cure the encapsulant composition is reduced. Production efficiencies may also be achieved by curing the encapsulant "off-line" (i.e. out of the mold or dispense machine) so that another package or set of packages may be encapsulated in such mold or machine, thereby increasing the production throughput.

In an alternative embodiment of the present invention, coverlay 13 is replaced by a platen which is juxtaposed with the top surface 11 of frame 11 before the thixotropic composition is dispensed or injected onto dielectric layer 4. In order to maintain the planarity of the resulting package, the platen must be substantially rigid and must remain fixed against the top surface of the frame during the encapsulation dispense operation. The platen may be equipped with a release liner or release surface, such as polytrifluoroethylene ("PTFE"), to prevent the cured encapsulant from adhering to the platen when the thixotropic composition cures.

In preferred embodiments, the reduced viscosity of the sheared thixotropic compound will be low enough to allow the composition to flow between the semiconductor chip 12 and the associated region 5 of the dielectric layer 4 and to fill the areas between such chips 12 and regions 5. The shearing force may be applied before the thixotropic composition is dispensed onto the dielectric layer, by for example, stirring the composition. In the alternative, the shearing force may be applied as the thixotropic composition is being dispensed onto the dielectric layer by dispensing the composition through a needle. In yet another alternative, the shearing force on the thixotropic composition is maintain until after the thixotropic composition has been dispensed by using a pressure injection system to dispense the composition. The thixotropic composition should remain under shear and with the accompanying reduced viscosity, until the areas between the chips 12 and the regions 5 are filled as desired. In preferred embodiments, the thixotropic composition is curable to form a silicone elastomer, a silicone gel, an epoxy, or a flexiblized epoxy. The assembly of FIG. 9 may be removed from the frame and cured in a curing oven. In the alternative, since the frame is relatively small and thin, the frame with the assembly attached may be cured in a curing oven. In preferred embodiments, the frame is constructed of a thin sheet of a reinforced epoxy such as Norplex CEM-1.

After the thixotropic composition is applied to the dielectric layer, the shear force may be continued to be applied in order to maintain the low viscosity of the composition and to insure that each microelectronic element is encapsulated as desired. The area between the dielectric layer and the microelectronic elements or the cover layer may be completely filled to completely encapsulate each microelectronic element or partially filled to partially encapsulate one or more of such microelectronic elements. Once sufficient shear force has been applied to the thixotropic composition to ensure that the areas between each microelectronic element and the dielectric layer will be completely filled with the thixotropic compositions, the shear force may be removed. Once the shear force is removed, the thixotropic material will begin to regain some or all of its initial higher viscosity.

Figure 11:
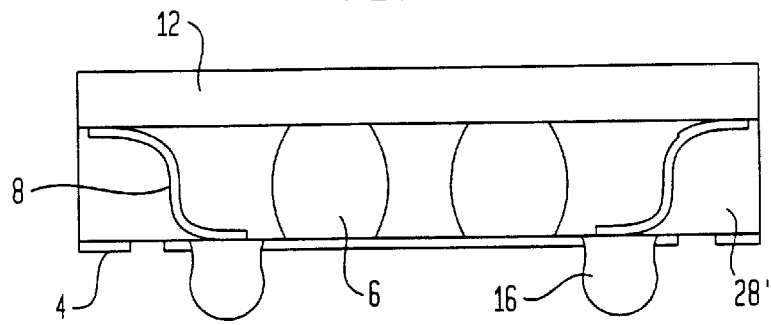
Figure 12:
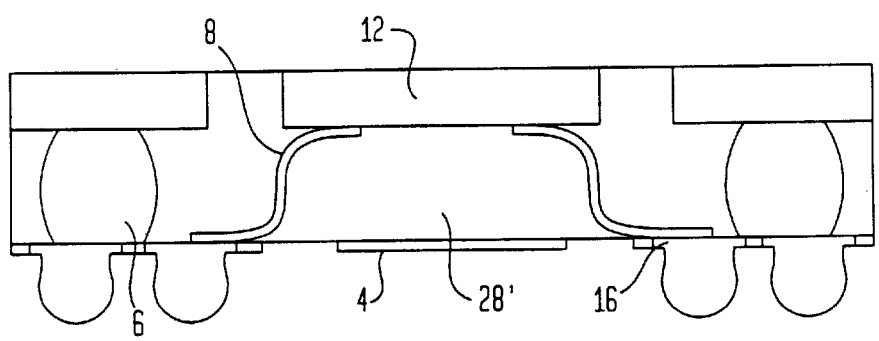
Figure 13:
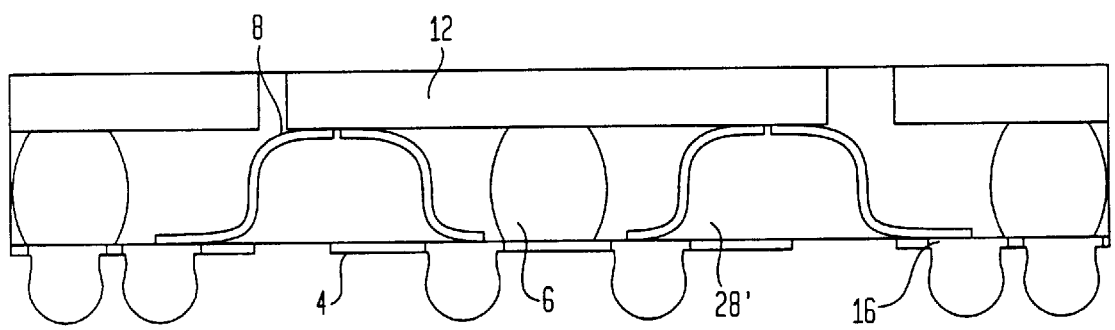
Figure 14:
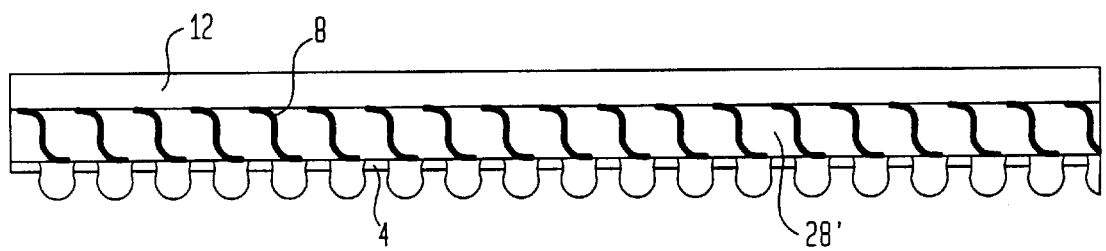

After the thixotropic composition has cured to form a cured layer between the chips and the dielectric layer, the assembly may be diced to form a plurality of semiconductor chip packages. A cross-sectional side view of the diced semiconductor chip package is depicted in FIG. 11. The semiconductor chip package depicted in FIG. 11 is a so-called "fan-in" type package. The method of the present invention may be used to make fan-in, fan-out, fan-in/fan-out and array area type packages. In a "fan-in" arrangement, the chip contacts are located within the periphery of the chip, each corresponding terminal is located on the flexible dielectric layer in a region that is closer to the center of the chip and each lead fans inwardly from a chip contact to a terminal. As depicted in FIG. 12, in a so-called "fan-out" arrangement, the chip contacts are located on the periphery of the chip, each corresponding terminal is located on the flexible dielectric layer in a region that is farther from the center of the chip and each lead fans outwardly from a chip contact to the corresponding terminal. Such a package may be made, for example, as disclosed in commonly assigned U.S. Pat. No. 5,688,716; U.S. Pat. No. 5,148,265; and U.S. patent application Ser. No. 08/365,749 filed on Dec. 28, 1994, the disclosures of which are incorporated by reference herein. As depicted in FIG. 13, in a fan-in/fan-out arrangement, some of the leads fan-in and some fan-out. Such a package may be made, for example, as disclosed in the aforementioned '265 patent and '749 patent application. The terminals are typically disposed in single rows and columns on the flexible dielectric layer, but may be disposed in a so called "area array", a grid like array on the primary surface of the flexible dielectric layer. A wafer scale package with an terminals arranged in an area array is depicted in FIG. 14. Such a package may be made, for example, as disclosed in commonly assigned U.S. Pat. No. 5,518,964; and U.S. Pat. No. 5,455,390, the disclosures of which are hereby incorporated by reference herein. A conductive adhesive, solder balls, solder or any other suitable bonding method may be used to bond each terminal to the corresponding connection pad on a support substrate.

Figure 10:
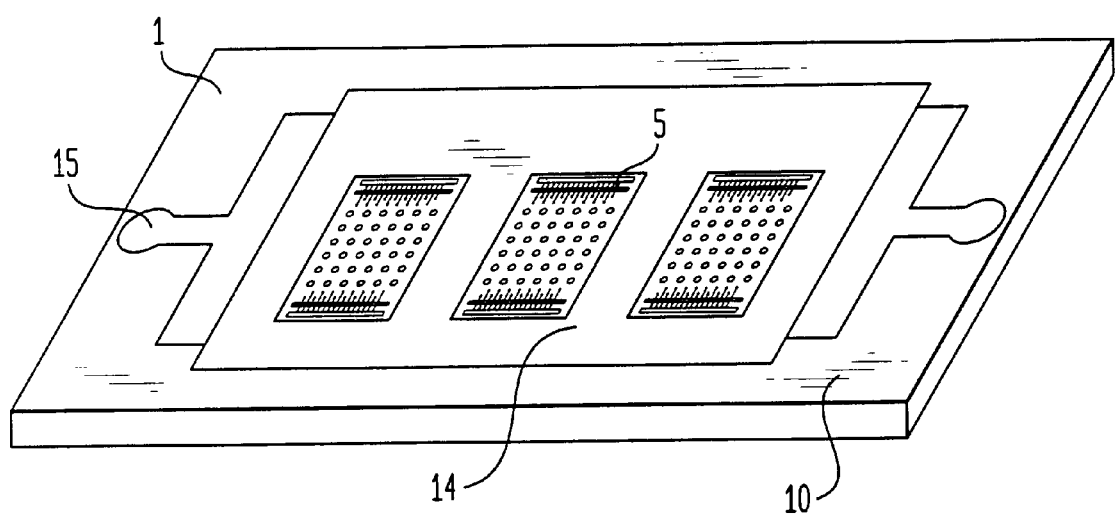

FIG. 10 is a top perspective view of a frame and a plurality of semiconductor chip packages of the prior art. The packages were manufactured according to the method of the present invention except that the encapsulant used did not have any or sufficient thixotropic properties to prevent the encapsulant composition from leaking or backflowing from the assembly.

Figure 15:
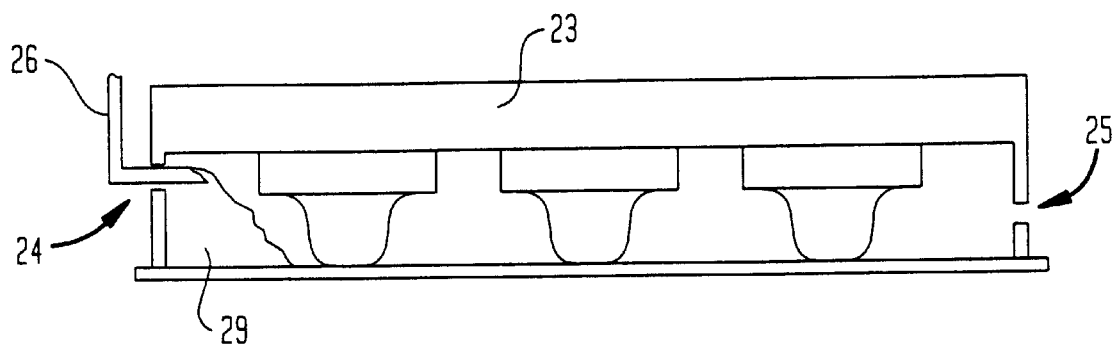
FIGS. 15–17 depict progressive steps in another embodiment of the present invention.
Figure 16:
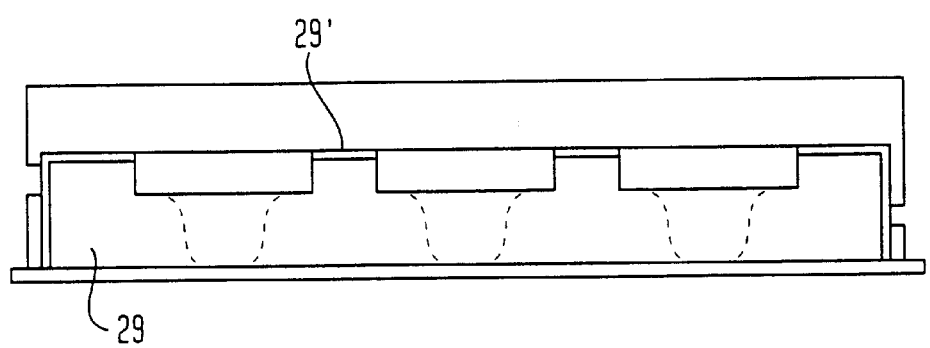
Figure 17:
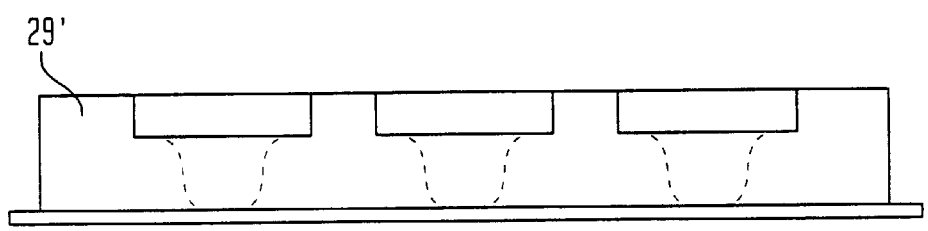

The present invention also relates to a method of packaging a semiconductor chip without using a mold during the encapsulant curing step and without the need to use a thixotropic encapsulating composition. The method of this aspect of the invention includes the step depicted in FIG. 1, wherein a dielectric layer 21 having at least one microelectronic element 21 is provided. Subsequent steps in the method of this aspect of the invention are depicted in FIGS. 15–17. As depicted in FIG. 15, mold 23 is sealingly engaged with dielectric layer 21. Mold 23 has at least one inlet port 24 and may have one or more vacuum ports 25. A dispense needle 26 is used to dispense a liquid composition 29 through inlet port 24 and into the mold cavity to fill the area between the microelectronic elements and the dielectric layer. As depicted in FIG. 16, a portion of liquid composition 29 is cured to form a cured skin of encapsulant 29'. As depicted in FIG. 17, mold 23 may then be removed and the uncured portion of liquid composition 29 is cured to form a cured encapsulant 29'. In preferred embodiments the liquid composition is curable to form an encapsulant selected from the group consisting of silicone elastomers, silicone gels and flexiblized epoxies. The dielectric sheet is preferably flexible. In particularly preferred embodiments, the dielectric sheet is comprised of a polyimide.

The methods of the present invention can be used at the wafer level to encapsulate an entire wafer by replacing the semiconductor chip with a wafer.

As these and other variations and combinations of the features discussed above can be utilized without departing from the present invention as defined by the claims, the foregoing description of the preferred embodiments should be taken as illustrating, rather than limiting, the invention as claimed.

That which is claim is:

1. A method of making a semiconductor chip package, said method comprising the steps of:

A. attaching at least one microelectronic element to a dielectric layer;

B. shearing a thixotropic composition to reduce its viscosity;

C. disposing the sheared thixotropic composition between the at least one microelectronic element and the dielectric layer; and D. curing the sheared thixotropic composition to form a cured encapsulant.

2. The method of claim 1, further comprising the step of

E. attaching the dielectric layer to a frame prior to the disposing step.

3. The method of claim 2, wherein step (E) is completed prior to step (A).

4. The method of claim 3, wherein the frame has a top surface and a bottom surface;

the at least one microelectronic element has a face surface and a back surface;

the dielectric sheet is disposed on the bottom surface of the frame;

the face surface of the at least one microelectronic element faces the dielectric sheet; and the method further comprises the step of:

F. attaching a coverlay to the bottom surface of the frame such that the coverlay is disposed over the back surface of the microelectronic element.

5. The method of claim 1, wherein at least a portion of steps (B) and (C) are conducted simultaneously.

6. The method of claim 5, wherein steps (B) and (C) are completed at substantially the same time.

7. The method of claim 6, wherein step (B) is completed before step (C) is completed.

8. The method of claim 7, wherein step (C) is completed before step (B) is completed.

9. The method of claim 1, wherein the dielectric sheet is flexible.

10. The method of claim 9, wherein the dielectric sheet is comprised of a polyimide.

11. The method of claim 1, wherein the thixotropic composition is curable to form a complaint encapsulant selected from the groups consisting of silicone elastomers, silicone gels and flexibilized epoxies.

12. The method of claim 1, wherein the at least one microelectronic element is a semiconductor chip.

13. The method of claim 1, wherein the at least one microelectronic element is a wafer.

14. The method of claim 1, wherein the initial viscosity of the thixotropic composition is greater than 150,000 centipoise at 25 C; the reduced viscosity is less than 10,000 centipoise at 25 C; and the time period required for the thixotropic composition to regain at least 65% if its initial viscosity is less than 1 minute.

* * * * *

UNITED STATES PATENT AND TRADEMARK OFFICE
CERTIFICATE OF CORRECTION

PATENT NO. : 6,218,215 B1
DATED : April 17, 2001
INVENTOR(S) : Thomas H. DiStefano and Craig S. Mitchell Page 1 of 1

It is certified that error appears in the above-identified patent and that said Letters Patent is hereby corrected as shown below:

Title page,
In the Inventor "Distefano" should read -- Di Stefano --.

Signed and Sealed this

Twenty-second Day of January, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO. : 6,218,215 B1
DATED : April 17, 2001
INVENTOR(S) : Thomas H. DiStefano and Craig S. Mitchell It is certified that error appears in the above-identified patent and that said Letters Patent is hereby corrected as shown below:

<u>Title page,</u>
Item [75], Inventor, "Distefano" should read -- Di Stefano --.

Signed and Sealed this

Thirty-first Day of December, 2002

JAMES E. ROGAN
*Director of the United States Patent and Trademark Office*